United States Patent

Cabuk

Patent Number: 5,598,107
Date of Patent: Jan. 28, 1997

[54] CURRENT SWITCHING CIRCUIT HAVING REDUCED CURRENT NOISE OPERATION

[75] Inventor: Nihat Cabuk, Waldkvanburg, Germany

[73] Assignee: Motorola, Inc., Schaumburg, Ill.

[21] Appl. No.: 435,602

[22] Filed: May 5, 1995

[30] Foreign Application Priority Data

May 19, 1994 [GB] United Kingdom .................. 9410087

[51] Int. Cl.$^6$ .................................................. H03K 17/16
[52] U.S. Cl. ................................. 326/27; 326/86; 326/17
[58] Field of Search ........................ 326/17, 26, 27–28, 326/83, 86

[56] References Cited

U.S. PATENT DOCUMENTS

| 4,859,870 | 8/1989 | Wong et al. | |
| 4,882,507 | 11/1989 | Tatsumi et al. | |
| 4,967,104 | 10/1990 | Ludwig et al. | 326/27 |
| 5,013,940 | 5/1991 | Ansel | 326/27 |
| 5,218,239 | 6/1993 | Boomer | 326/27 |
| 5,455,521 | 10/1995 | Dobbelaere | 326/17 |
| 5,497,105 | 3/1996 | Oh et al. | 326/27 |

FOREIGN PATENT DOCUMENTS 0535873 4/1993 European Pat. Off. ... H03K 19/0185

Primary Examiner—David R. Hudspeth
Attorney, Agent, or Firm—Harry A. Wolin; Rennie William Dover

[57] ABSTRACT

A current switching circuit (10) receives an input signal having one of an upper and a lower signal level. First (60) and second (70) transistors switch an output (115) between the upper and the lower signal level in response to the input signal. A first high resistance path (80) is selectively coupled via a gate (75) between the first transistor (60) and a first potential. A second high resistance path (90) is selectively coupled via a gate (85) between the second transistor (70) and a second potential. A control input (20) causes a logic arrangement (22) to control the gates (75, 85) thereby selectively coupling the high resistance paths (80, 90) to the first (60) and second (70) transistors such that they can switch the output at a first and a second switching speed.

4 Claims, 2 Drawing Sheets

CURRENT SWITCHING CIRCUIT HAVING REDUCED CURRENT NOISE OPERATION

FIELD OF THE INVENTION

This invention relates to current switching circuits.

BACKGROUND OF THE INVENTION

A current switching circuit incorporated in a semiconductor device switches an output of the device between high and low states. The current switching circuit typically controls the switching of two transistors in a well known push-pull configuration.

Current switching noise (current spikes) occurring when the transistors are switched causes a problem within the device, especially if more than one output is being switched simultaneously, as in the case of a parallel multi-line data path where several lines may be switched simultaneously.

Current switching circuits are known which slow down the transistor slew rate (voltage-time gradient), hence reducing the magnitude of the current spikes. However, these also effectively reduce the switching speed of the output. Therefore designers utilising known switching circuits have been forced to choose between switching circuits which are either slow or noisy.

This invention seeks to provide a current switching circuit in which the above mentioned disadvantages are mitigated.

SUMMARY OF THE INVENTION

According to the present invention there is provided a current switching circuit comprising an output; an input for receiving an input signal having one of an upper and a lower signal level; first and second current switching means responsive to the input signal for switching the output between first and second signal levels in dependence upon the input signal;
a first high resistance path selectively coupled between the first switching means and a first potential; a second high resistance path selectively coupled between the second switching means and a second potential; control means coupled to the first and second current switching means and to the first and second high resistance paths for providing control of the selective coupling therebetween in response to a control signal, wherein in dependence on the control signal the control means selectively couples the respective high resistance paths to the respective current switching means such that the output is switched at at least two switching speeds depending on whether the respective high resistance paths are coupled to the respective current switching means.

Preferably the current switching circuit further comprises at least one further supplementary high resistance path selectively coupled between each of the first and the second switching means and the first and second potentials, the control means controlling the selective coupling thereof such that the first and second current switching means switch the output at at least three switching speeds.

The first and second current switching means are preferably composed of transistors in pull-up and pull-down configurations respectively. The resistance paths are preferably composed of transistors in diode coupled configurations. Preferably the current switching circuit is fabricated in MOS technology.

In this way a current switching circuit is provided which operates in normal and slow modes, allowing both normal switching speed operation and slow switching speed operation with reduced current noise.

BRIEF DESCRIPTION OF THE DRAWINGS

An exemplary embodiment of the invention will now be described with reference to the drawing in which.

DETAILED DESCRIPTION OF A PREFERRED EMBODIMENT

Figure 1:
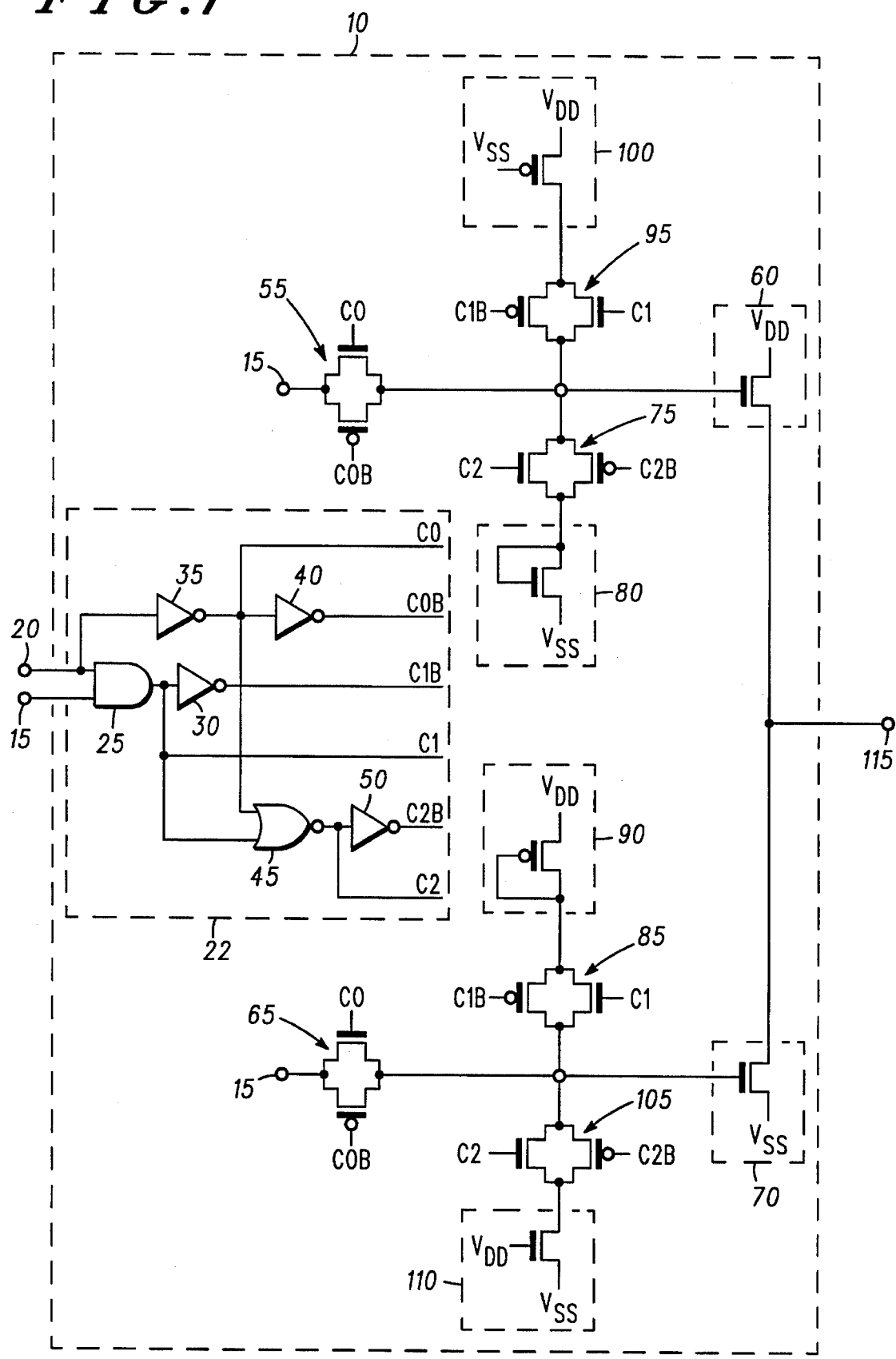
FIG. 1 shows a preferred embodiment of a current switching circuit in accordance with the invention.

Referring to FIG. 1, there is shown a current switching circuit 10. A data input terminal 15 of the circuit 10 is coupled to receive a data signal which is arranged to be in either one of a high or low state. A control input terminal 20 is coupled to receive a control signal to be further explained hereafter.

A logic arrangement 22 of the circuit 10 includes a (logical) AND gate 25 having two inputs coupled to the data input terminal 15 and the control input terminal 20 and an output C1. A first NOT gate 30 of the arrangement 22 has an input coupled to C1 and barred output C1B. Therefore the outputs C1 and C1B are mutually exclusive.

A second NOT gate 35 has an input coupled to the control input terminal 20 and an output C0. A third NOT gate 40 has an input coupled to the output C0 and a barred output C0B. In this way the outputs C0 and C0B are mutually exclusive. A NOR gate 45 has two inputs coupled to C0 and C1 and an output C2. A fourth NOT gate 50 is coupled to the output C2 and has a barred output C2B. Therefore in a similar way to the cases above the outputs C2 and C2B are mutually exclusive.

A PMOS Transistor 60 has a control terminal and two conducting terminals. The control terminal is coupled via a first transmission gate 55 to the data input terminal 15. The first transmission gate 55 is composed of two transistors in a well known complementary configuration. The two transistors have control input terminals coupled to the outputs C0 and C0B respectively. The two conducting terminals of the PMOS transistor 60 are coupled to the supply voltage VDD and to an output terminal 115 respectively. In this way the PMOS transistor 60 is used in a pull up configuration, to selectively couple the supply voltage VDD to the output terminal 115.

In a similar way an NMOS transistor 70 has a control terminal and two conducting terminals. The control terminal is coupled via a second transmission gate 65 to the data input terminal 15. The second transmission gate 65 is of the same configuration as the first transmission gate 55, again having two transistors with control inputs coupled to the outputs C0 and C0B respectively. The two conducting terminals of the NMOS transistor 70 are coupled to the ground Vss and to the output terminal 115 respectively. In this way the NMOS transistor 70 is used in a pull down configuration, to selectively couple the ground Vss to the output terminal 115.

The control terminal of the PMOS transistor 60 is further coupled via a third transmission gate 75 to the ground Vss through a transistor 80 in a diode coupled configuration. The third transmission gate 75 has control inputs coupled to outputs C2 and C2B.

Similarly the control terminal of NMOS transistor 70 is coupled via a fourth transmission gate 85 to supply voltage VDD through a second transistor 90 in a diode coupled configuration. The fourth transmission gate 85 has control inputs coupled to outputs C1 and C1B.

The control terminal of the PMOS transistor 60 is further coupled via a fifth transmission gate 95 to a third transistor 100 in a pull-up configuration. The fifth transmission gate 95 has control inputs coupled to outputs C1 and C1B.

Similarly the control terminal of the NMOS transistor 70 is further coupled via a sixth transmission gate 105 to a fourth transistor 110 in a pull-down configuration. The sixth transmission gate 105 has control inputs coupled to outputs C2 and C2B.

In operation, the data signal received by the data input terminal typically switches between the high and the low state. The circuit 10 is arranged to work in either slow or normal modes, depending on the value of the control signal at the control input terminal 20. In the first case, with the control signal in a low state, the circuit 10 is in normal mode.

The following truth table shows the values of the outputs C0, C1 and C2 as derived from the logic network of gates 25, 30, 35, 40, 45 and 50.

| Control | Mode   | Data | C0 | C1 | C2 |
|---------|--------|------|----|----|----|
| 0       | Normal | 0    | 1  | 0  | 0  |
| 0       | Normal | 1    | 1  | 0  | 0  |
| 1       | Slow   | 0    | 0  | 0  | 1  |
| 1       | Slow   | 1    | 0  | 1  | 0  |

The first and second transmission gates 55 and 65 respectively are on permanently during this mode (by virtue of the output C0). Conversely, the other transmission gates are off permanently in the normal mode.

Figure 2:
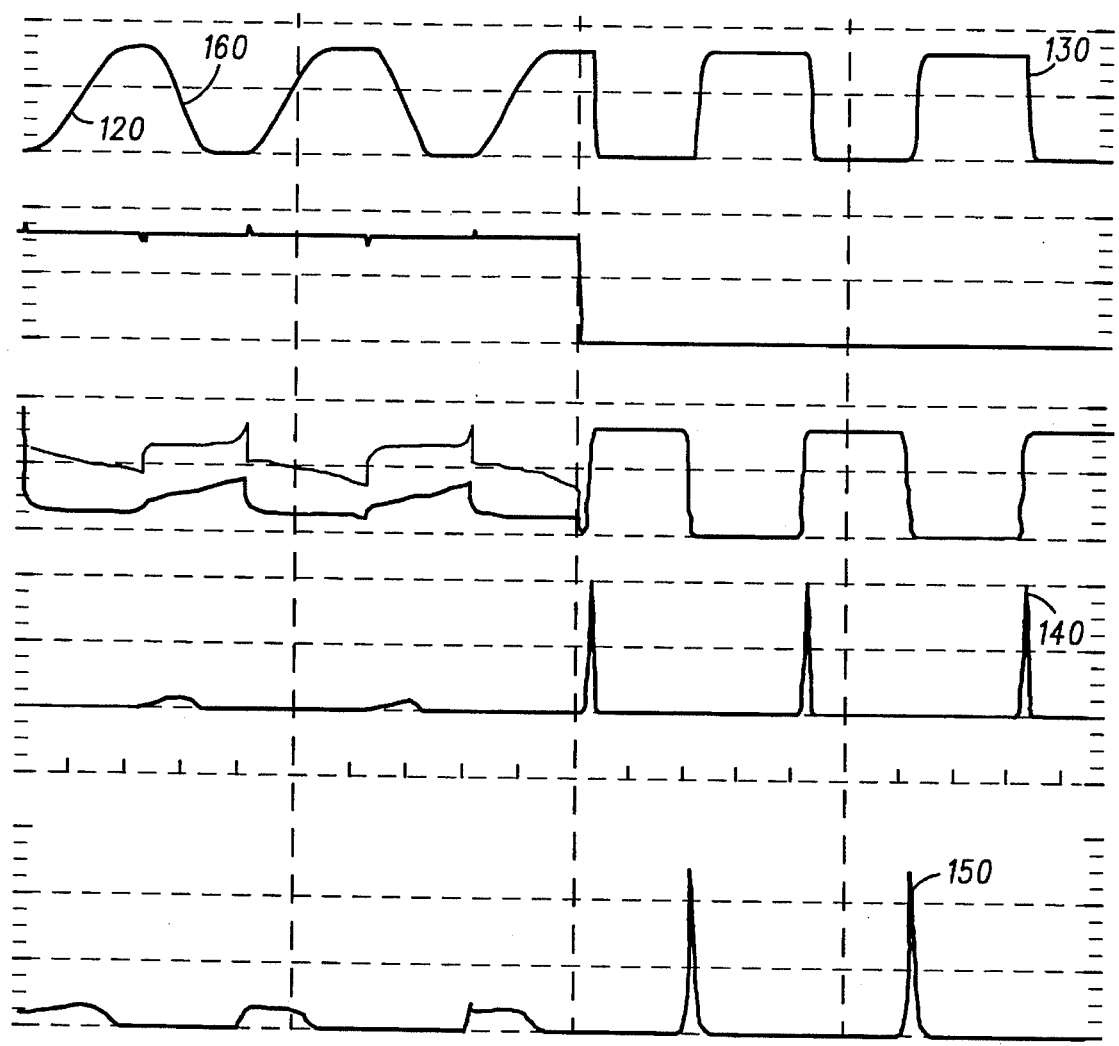
FIG.2 shows an exemplary graph of the operation of the current switching circuit of FIG. 1.

In this way the control terminals of the PMOS transistor 60 and the NMOS transistor 70 are fed directly from the data signal, and the output terminal 115 receives a normally switched output signal (line 130 of FIG. 2). The output signal 130 is inverted with respect to the data signal at the data input terminal 15.

Pull current spikes 140 and push current spikes 150 are associated with the switching of the normal mode, which give rise to noise on the output terminal 115 and on the VDD and Vss lines due to parasitic inductances.

In the second case, with the control signal set to the high state, the circuit 10 is in slow mode. The first and second transmission gates 55 and 65 respectively are off permanently during this mode (by virtue of the output C0). The remainder of the transmission gates, 75, 85, 95 and 105 are dependent on the state of the data signal. If the data signal is low, C1 is low (gates 85 and 95 off) and C2 is high (gates 75 and 105 on). If the data signal is high, C1 is high and C2 is low, with the opposite conditions for the gates 75, 85, 95 and 105.

Taking the condition of a data signal transition from low to high, the NMOS transistor 70 is initially off by virtue of transmission gate 105 which couples the control terminal of the NMOS transistor 70 to the transistor 110. Conversely, the PMOS transistor 60 is initially on by virtue of transmission gate 75 which couples the control terminal of the PMOS transistor 60 to the diode coupled configuration transistor 80. When the transition occurs, the output C2 becomes low and the output C1 becomes high. Therefore transmission gates 75 and 105 are turned off, and transmission gates 85 and 95 are turned on.

Therefore the control terminal of the NMOS transistor 70 becomes coupled to the diode coupled transistor 90, which presents a very large impedance between the control terminal and $V_{DD}$. At the same time, the control terminal of the PMOS transistor 60 becomes coupled to the transistor 100.

Therefore the PMOS transistor 60 is turned off very quickly, while the NMOS transistor 70 is turned on relatively slowly. This gives rise to the shallow ramp 120 of the output signal at the output terminal 115. Furthermore, substantially no residual current is left in the region of the output terminal 115 to be pulled up by the PMOS transistor 60 because of the simultaneous conduction of the transistors 60 and 70, and therefore current is not wasted, as is the case in normal mode.

For the condition of a data signal transition from high to low, a similar procedure occurs, with the NMOS transistor 70 being turned off very quickly and the PMOS transistor 60 being turned on relatively slowly, to give rise to the shallow ramp 160.

In this way, the circuit 10 has two modes of operation, a normal mode which is fast but which gives rise to voltage spikes, and a slow mode which is slower than the normal mode, but which substantially prevents the voltage spikes of the normal mode.

It will be appreciated that alternative embodiments to the one described above may be achieved. For example, by augmenting the diode configuration transistors 80 and 90 with further transistors having different impedances, it is possible to achieve a plurality of different slow modes, each having a different ramp gradient, according to the impedances.

Furthermore, the transmission gates and the transistors may be implemented in an alternative technology to the MOS technology used, such as Bipolar technology.

I claim:

1. A current switching circuit comprising an output; an input for receiving an input signal having one of an upper and a lower signal level; first and second current switching means responsive to the input signal for switching the output between first and second signal levels in dependence upon the input signal; a first diode coupled transistor selectively coupled between the first switching means and a first potential; a second diode coupled transistor selectively coupled between the second switching means and a second potential; control means coupled to the first and second current switching means and to the first and second diode coupled transistors for providing control of the selective coupling therebetween in response to a control signal, wherein in dependence on the control signal the control means selectively couples the respective diode coupled transistors to the respective current switching means such that the output is switched at least two switching speeds depending on whether the respective diode coupled transistor are coupled to the respective current switching means, such that at the lower switching speed, residual current present between the first and second switching means is substantially reduced.

2. The current switching circuit of claim 1 wherein the current switching circuit further comprises at least one further supplementary diode coupled transistor selectively coupled between each of the first and the second switching means and the first and second potentials, the control means controlling the selective coupling thereof such that the first and second current switching means switch the output at least three switching speeds.

3. The current switching circuit of claim 1 wherein the first and second current switching means are composed of transistors in pull-up and pull-down configurations respectively.

4. The current switching circuit of claim 1, when fabricated in MOS technology.

* * * * *